United States Patent
Huang et al.

(10) Patent No.: US 11,551,923 B2
(45) Date of Patent: Jan. 10, 2023

(54) TAIKO WAFER RING CUT PROCESS METHOD

(71) Applicant: Phoenix Silicon International Corp., Hsinchu (TW)

(72) Inventors: Chien-Hsiung Huang, Hsinchu (TW); Chao-Tsung Tsou, Hsinchu (TW); Cheng-Yen Lin, Hsinchu (TW)

(73) Assignee: PHOENIX SILICON INTERNATIONAL CORP., Hsinchu (TW)

(*) Notice: Subject to any disclaimer, the term of this patent is extended or adjusted under 35 U.S.C. 154(b) by 83 days.

(21) Appl. No.: 17/149,805

(22) Filed: Jan. 15, 2021

(65) Prior Publication Data

US 2022/0230869 A1    Jul. 21, 2022

(51) Int. Cl.
*H01L 21/02* (2006.01)
*H01L 21/683* (2006.01)

(52) U.S. Cl.
CPC .... *H01L 21/02021* (2013.01); *H01L 21/6836* (2013.01)

(58) Field of Classification Search
None
See application file for complete search history.

(56) References Cited

U.S. PATENT DOCUMENTS

| | | | |
|---|---|---|---|
| 2016/0064230 A1* | 3/2016 | Nishihara | B24B 37/042 451/41 |
| 2016/0155656 A1* | 6/2016 | Matsumura | H01L 21/6838 438/464 |
| 2017/0278801 A1* | 9/2017 | Park | B23K 26/364 |
| 2017/0301571 A1* | 10/2017 | Tsuchiya | H01L 21/6836 |
| 2019/0088468 A1* | 3/2019 | Chen | B08B 3/024 |
| 2019/0148130 A1* | 5/2019 | Chiang | H01L 21/3043 257/797 |

* cited by examiner

*Primary Examiner* — Khaja Ahmad
(74) *Attorney, Agent, or Firm* — WPAT, PC

(57) ABSTRACT

A Taiko wafer ring cut process method is provided. The Taiko wafer ring cut process method includes the following steps. A Taiko wafer is disposed on the platform. The Taiko wafer is performing by laser ring cutting so that a Taiko ring and an edge portion of the Taiko wafer are separated from a wafer portion of the Taiko wafer. The wafer portion of the Taiko wafer is adhered to a frame.

3 Claims, 5 Drawing Sheets

S100

S110 — a Taiko wafer is disposed on a platform

S120 — a laser beam is used to perform ring cutting on the Taiko wafer, so that the edge portion and the Taiko ring of the Taiko wafer are separated from the wafer portion of the Taiko wafer S130 — the wafer portion of the Taiko wafer is pasted on a frame

FIG. 5

TAIKO WAFER RING CUT PROCESS METHOD

TECHNICAL FIELD

The invention relates to a Taiko wafer ring cut process method.

BACKGROUND

In order to meet the needs of ultra-thin wafers, Taiko polishing is currently the most critical process. But for wafer packaging, the Taiko ring produced by Taiko polishing is an important factor affecting the process. Taiko polishing technology does not thin the entire surface of the wafer, and it only thins the middle part of the wafer. The edge of the wafer is not polished and thinned, leaving the edge of the wafer with the same ring as the drum frame of Japanese drums, which is called Taiko Ring. The Taiko Ring can support the edge of the wafer so that the wafer will not warpage.

The conventional technology is a frame mount process in which the wafer is first glued to the dicing frame after the thinning process. Then use the cutting blade to remove the Taiko ring to facilitate the packaging factory operations. Because the Taiko ring protrudes from the edge of the wafer, the frame mounting process will cause incomplete coverage or air bubbles in the Taiko ring area. Furthermore, during the dicing process, the wafer is affected by the high-speed cutting action of the blade, which may cause wafer cracks and edge chipping. Thus, the yield of the conventional technology cannot be optimized.

Moreover, it is necessary to remove the Taiko ring after cutting. Because the Taiko ring is still stuck by the tape at this time, when the Taiko ring is removed from the tape, the tape will be pulled together and the abnormal phenomenon of cracks on the edge of the wafer will be caused.

Therefore, how to improve and provide a Taiko wafer ring cut process method to avoid the above-mentioned problems is a problem to be solved in the industry.

SUMMARY

The present invention provides a Taiko wafer ring cut process method that uses a laser cutting method to improve the micro-chip after cutting and improve the yield rate of Taiko ring cutting. The invention also changes the manufacturing process to avoid the abnormal phenomenon of cracks on the edge of the wafer caused by the pulling of the tape when the Taiko ring is removed.

One embodiment of the present invention provides a Taiko wafer ring cut process method including the following steps. A Taiko wafer is disposed on a platform, wherein the Taiko wafer has a wafer portion, an edge portion and a Taiko ring, the edge portion is located at the outer edge of the wafer portion and the ring is connected to the edge portion. A laser beam is used to perform ring cutting on the Taiko wafer, so that the edge portion and the Taiko ring of the Taiko wafer are separated from the wafer portion of the Taiko wafer. The wafer portion of the Taiko wafer is pasted on a frame.

In a preferred embodiment, the step of disposing the Taiko wafer on the platform further comprises using vacuum suction to fix the Taiko wafer on the platform.

In a preferred embodiment, before the step of using vacuum suction to fix the Taiko wafer on the platform, it includes positioning the Taiko wafer on the platform.

In a preferred embodiment, the step of positioning the Taiko wafer on the platform includes disposing a plurality of positioning portions on the platform making the positioning portions abut the Taiko ring of the Taiko wafer.

In a preferred embodiment, the step of using the laser beam to perform ring cutting on the Taiko wafer further comprises the laser beam rotating around the Taiko wafer to cut the edge portion of the Taiko wafer; and removing the edge portion and the Taiko ring of the Taiko wafer.

In a preferred embodiment, the step of pasting the wafer portion of the Taiko wafer on the frame further comprises disposing the frame on the wafer portion; and pasting a tape on the wafer portion and the frame to fix the wafer portion on the frame.

Based on the above, the present invention uses a laser cutting method to replace the traditional blade cutting, and adjusts the laser beam to improve the micro-chip after cutting and increase the yield rate of Taiko ring cutting.

In additional, in order to improve the abnormal phenomenon of cracks on the edge of the wafer caused by the pulling of the tape when the Taiko ring is removed, the manufacturing process of the present invention is changed to first perform the Laser Ring Cutting operation to cut the Taiko ring, and then perform the frame mounting process, without the abnormal phenomenon of cracks on the edge of the wafer caused by pulling the tape.

In order to further understand and understand the features, objectives, and functions of the present invention, the embodiments of the present invention are described in detail with reference to the drawings.

BRIEF DESCRIPTION OF THE DRAWINGS

FIG. 5 is flow chart of the Taiko wafer ring cut process method of the present invention.

DETAILED DESCRIPTION

Figure 1:
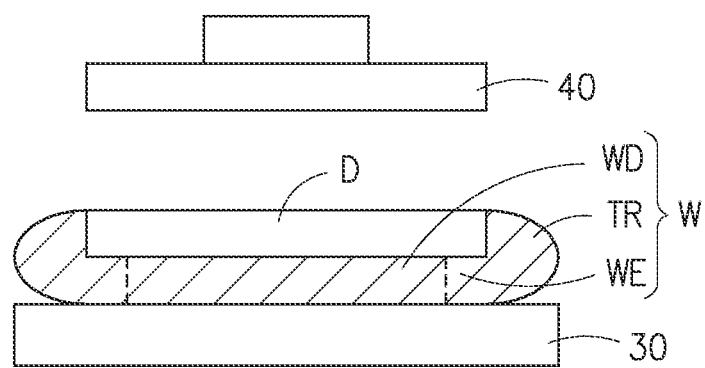
FIG. 1 is a schematic diagram of an embodiment of the Taiko polishing process of the present invention.

The specific implementation of the present invention will be further described below in conjunction with the drawings and embodiments. The following embodiments are only used to illustrate the technical solutions of the present invention more clearly, and cannot be used to limit the protection scope of the present invention.

In the description of each embodiment, when an element is described as "above" or "below" another element, it refers to a situation where it is directly or indirectly above or below the other element, which may contain other elements set in between. The so-called "directly" means that there are no other intermediary elements in between. Descriptions such as "above" or "below" are described based on the drawings, but also include other possible direction changes. For the convenience and clarity of illustration, the thickness or size of each element in the drawings is shown in an exaggerated, omitted, or sketched manner, and the size of each element is not exactly its actual size.

FIG. 1 is a schematic diagram of an embodiment of the Taiko polishing process of the present invention. Please refer to FIG. 1, in this embodiment, the Taiko wafer ring cut process method process method is applicable to the Taiko wafer W formed by the backside grinding (BG) process of wafer thinning. As shown in FIG. 1, the grinding wheel 40 is used to grind the grinding area D of the wafer on the placement platform 30, and the grinding area D of the wafer is located in the middle of the wafer. For example, it is the Taiko wafer W that has been ground by the grinding wheel 40, and the grinding area D is the portion that is removed after being polished or etched. The Taiko wafer W includes a wafer portion WD, an edge portion WE, and a Taiko ring TR. The edge portion WE is located at the outer edge of the wafer portion WD, and the Taiko ring TR is connected to the edge portion WE. That is, the edge portion WE is connected between the wafer portion WD and the Taiko ring TR. The Taiko ring TR can support the edge portion WE of the Taiko wafer W, which can greatly reduce the warpage of the Taiko wafer W when it is extremely thin. The following describes the Taiko wafer ring cut process method of the present invention with reference to FIGS. 2 to 5.

Figure 2:
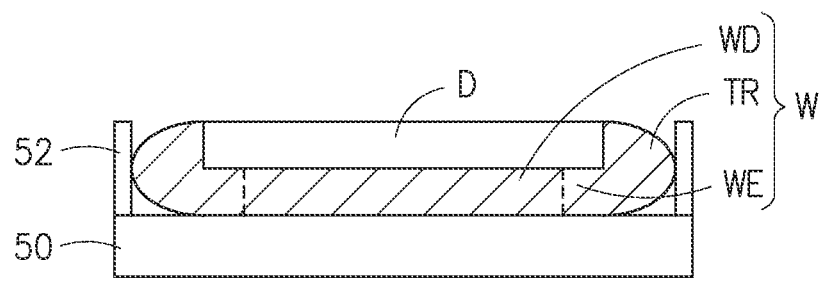
FIG. 2 is a schematic diagram of an embodiment of disposing Taiko wafers on a platform according to the present invention.
Figure 3A:
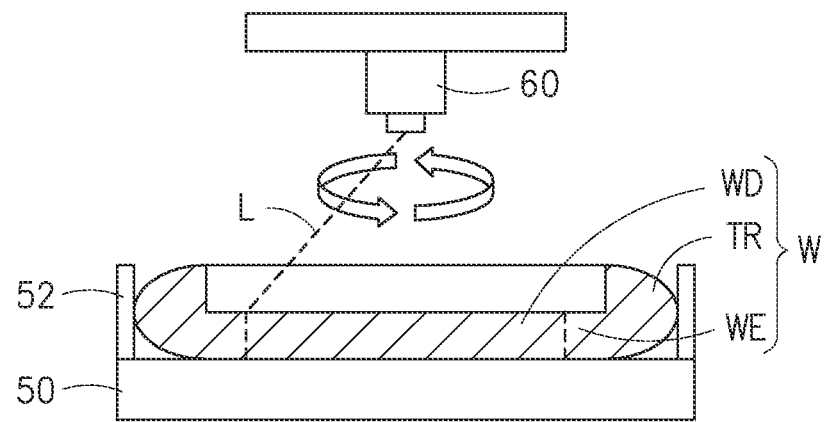
FIG. 3A is a schematic diagram of ring cutting of a Taiko wafer by a laser beam of the present invention.
Figure 3B:
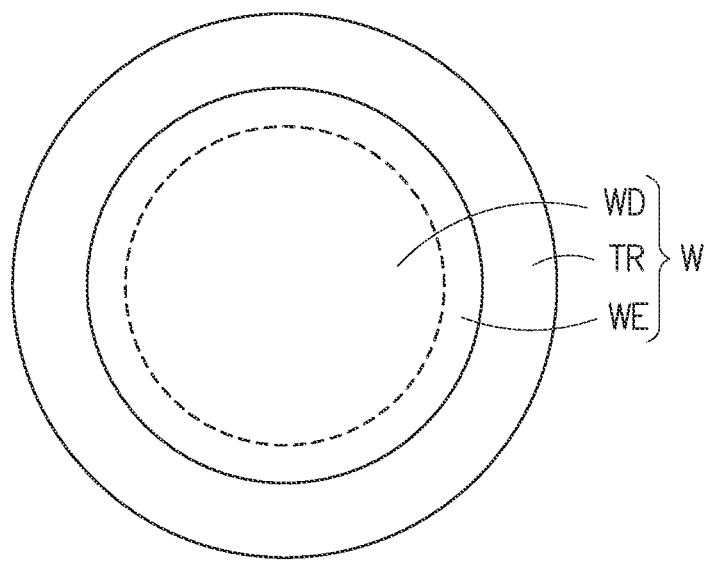
FIG. 3B is a schematic diagram of the Taiko wafer in FIG. 3A.
Figure 3C:
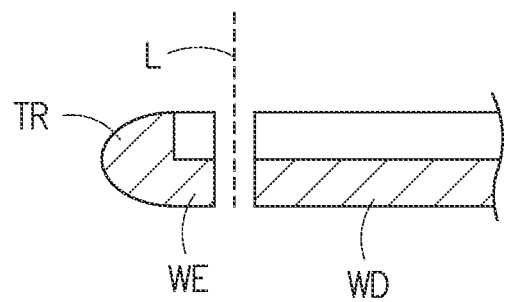
FIG. 3C is a partial schematic diagram of ring cutting of the Taiko wafer in FIG. 3A.
Figure 3D:
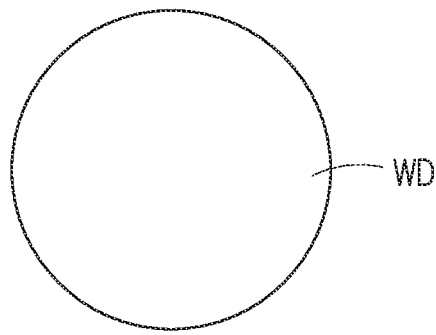
FIG. 3D is a schematic diagram of the wafer portion of the Taiko wafer of FIG. 3A after being cut.
Figure 4A:
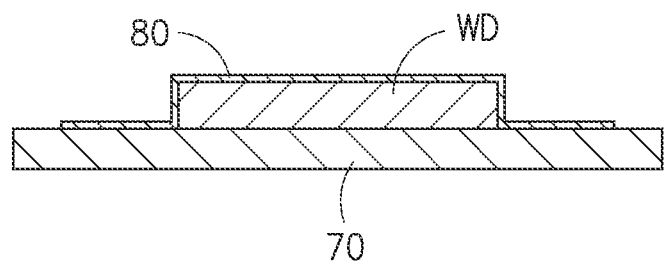
FIG. 4A is a schematic diagram of the wafer portion of the Taiko wafer of the present invention attached to the frame.
Figure 4B:
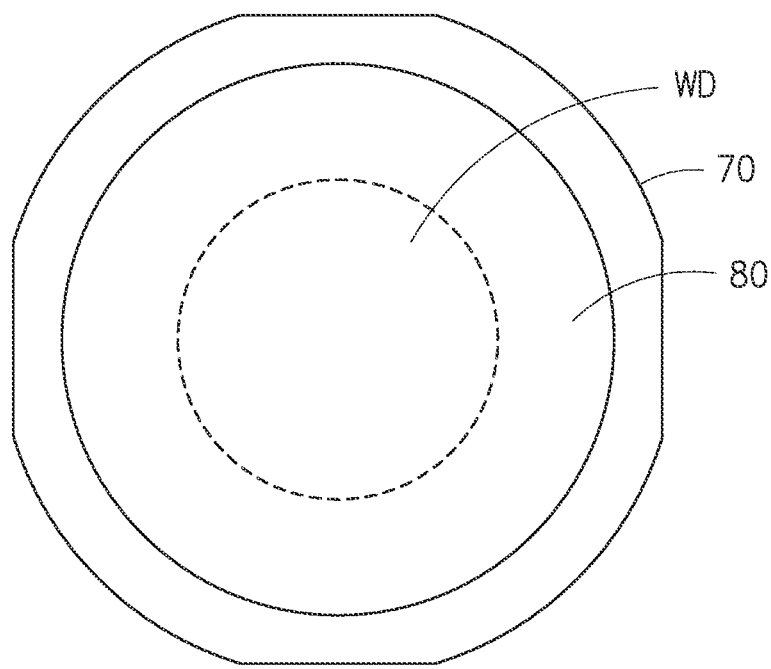
FIG. 4B is a schematic top view of the wafer portion of the Taiko wafer of FIG. 4A being pasted on the frame.

FIG. 2 is a schematic diagram of an embodiment of disposing Taiko wafers on a platform according to the present invention. FIG. 3A is a schematic diagram of ring cutting of a Taiko wafer by a laser beam of the present invention. FIG. 3B is a schematic diagram of the Taiko wafer in FIG. 3A. FIG. 3C is a partial schematic diagram of ring cutting of the Taiko wafer in FIG. 3A. FIG. 3D is a schematic diagram of the wafer portion of the Taiko wafer of FIG. 3A after being cut. FIG. 4A is a schematic diagram of the wafer portion of the Taiko wafer of the present invention attached to the frame. FIG. 4B is a schematic top view of the wafer portion of the Taiko wafer of FIG. 4A being pasted on the frame. FIG. 5 is flow chart of the Taiko wafer ring cut process method of the present invention. The Taiko wafer ring cut process method S100 includes the following steps S110 to S130. First, a Taiko wafer W is disposed on a platform 50, and step S110 is performed as shown in FIG. 2. The Taiko wafer W includes a wafer portion WD, an edge portion WE, and a Taiko ring TR. In detail, the step of disposing the Taiko wafer W on the platform 50 includes positioning the Taiko wafer W on the platform 50. Taking FIG. 2 as an example, a plurality of positioning portions 52 are disposed on the platform 50 so that the positioning portions 52 abut against the Taiko ring TR of the Taiko wafer W, thereby positioning and fixing the position of the Taiko wafer W. This embodiment does not limit the method of fixing the Taiko wafer W. For example, the platform 50 may be a vacuum suction platform. In other words, the present invention can use vacuum suction to fix the Taiko wafer W on the platform 50.

Next, a laser beam L is used to perform ring cutting on the Taiko wafer W, and step S120 is performed as shown in FIG. 3A. The present invention can provide a laser module 60, the laser module 60 is disposed on the platform 50, and the laser module 60 is used to emit the laser beam L. In this embodiment, the distance from the center of the Taiko wafer W to the edge portion WE of the Taiko wafer W is set as the radius of rotation. With the polarizer in the laser module 60, the laser beam L can be lasered according to the pattern set by the machine, so that the laser beam L rotates around the Taiko wafer W to cut the edge portion WE of the Taiko wafer W (as shown in FIG. 3A or FIG. 3C). Since the edge portion WE of the Taiko wafer W is cut by the laser beam, the Taiko ring TR connected to the edge portion WE of the Taiko wafer W is also cut, so that the edge portion WE and Taiko ring TR of Taiko wafer W can be separated from the wafer portion WD of Taiko wafer W. Next, remove the edge portion WE and the Taiko ring TR of the Taiko wafer W, leaving the wafer portion WD of the Taiko wafer W (as shown in FIG. 3D).

Next, step S130 is performed as shown in FIGS. 4A and 4B, and the wafer portion WD of the Taiko wafer W is pasted on a frame 70, which is, for example, a metal frame. It should be noted that, in order to facilitate the description of the position of the tape 80 and the wafer portion WD and the frame 70 in FIG. 4A, the frame 70 is disposed under the wafer portion WD, and the tape 80 is pasted on the wafer portion WD and the frame 70. In fact, the frame 70 and the tape 80 are respectively located on the upper and lower sides of the wafer portion WD, the frame 70 is placed on the wafer portion WD, and the tape 80 is pasted under the wafer portion WD and the frame 70. In detail, the step of pasting the wafer portion WD of the Taiko wafer W on the frame 70 includes disposing the frame 70 on the wafer portion WD after removing the edge portion WE and the Taiko ring TR of the Taiko wafer W. Then, a tape 80 is pasted on the wafer portion WD and the frame 70 to fix the wafer portion WD on the frame 70. In other words, in this step, the frame mount process is performed, using a tape 80 with an adhesive on one side. The tape 80 is a dicing tape to stick the wafer part WD on the frame 70 for dicing.

In summary, the present invention uses a laser cutting method to replace the traditional blade cutting, and adjusts the laser beam to improve the micro-chip after cutting and increase the yield rate of Taiko ring cutting.

In additional, in order to improve the abnormal phenomenon of cracks on the edge of the wafer caused by the pulling of the tape when the Taiko ring is removed, the manufacturing process of the present invention is changed to first perform the Laser Ring Cutting operation to cut the Taiko ring, and then perform the frame mounting process, without the abnormal phenomenon of cracks on the edge of the wafer caused by the pulling of the tape.

The above is intended to be illustrative only and not limiting. Any other equivalent modifications or alterations of the present invention are intended to be included in the scope of the appended claims. Therefore, the protection scope of the present invention shall be subject to those defined by the attached claims.

What is claimed is:

1. A Taiko wafer ring cut process method, comprising the steps of:
   disposing a Taiko wafer on a platform, wherein the Taiko wafer has a wafer portion, an edge portion and a Taiko ring, the edge portion is located at the outer edge of the wafer portion and the ring is connected to the edge portion, comprising the steps of:
   positioning the Taiko wafer on the platform, comprising the steps of:
   disposing a plurality of positioning portions on the platform such that the positioning portions abut the Taiko ring of the Taiko wafer;
   using a laser beam to perform ring cutting on the Taiko wafer, wherein the laser beam rotates around the Taiko wafer based on a center of the Taiko wafer to cut the edge portion of the Taiko wafer, and the edge portion and the Taiko ring are separated and removed from the wafer portion; and pasting the wafer portion of the Taiko wafer on a frame after ring cutting.

2. The Taiko wafer ring cut process method as recited in claim 1, wherein the step of disposing the Taiko wafer on the platform further comprises using vacuum suction to fix the Taiko wafer on the platform.

3. The Taiko wafer ring cut process method as recited in claim 1, wherein the step of pasting the wafer portion of the Taiko wafer on the frame further comprises the steps of:

disposing the frame on the wafer portion; and pasting a tape on the wafer portion and the frame to fix the wafer portion on the frame.

* * * * *